US010706983B2

(12) United States Patent
Kwon et al.

(10) Patent No.: US 10,706,983 B2
(45) Date of Patent: Jul. 7, 2020

(54) MASS PRODUCTION METHOD OF LOADING RADIOISOTOPES INTO RADIOVOLTAICS

(71) Applicant: The Curators of the University of Missouri, Columbia, MO (US)

(72) Inventors: Jae Wan Kwon, Columbia, MO (US); John Michel Gahl, Columbia, MO (US); Bradley Ryan Nullmeyer, Columbia, MO (US)

(73) Assignee: The Curators of the University of Missouri, Columbia, MO (US)

( * ) Notice: Subject to any disclaimer, the term of this patent is extended or adjusted under 35 U.S.C. 154(b) by 95 days.

(21) Appl. No.: 15/302,628

(22) PCT Filed: Apr. 13, 2015

(86) PCT No.: PCT/US2015/025585
§ 371 (c)(1),
(2) Date: Oct. 7, 2016

(87) PCT Pub. No.: WO2015/157764
PCT Pub. Date: Oct. 15, 2015

(65) Prior Publication Data
US 2017/0032862 A1 Feb. 2, 2017

Related U.S. Application Data

(60) Provisional application No. 61/995,496, filed on Apr. 11, 2014.

(51) Int. Cl.
*G21G 1/04* (2006.01)
*G21H 1/04* (2006.01)
(Continued)

(52) U.S. Cl.
CPC ............ *G21H 1/04* (2013.01); *G21G 1/04* (2013.01); *G21H 1/06* (2013.01); *H01L 27/14* (2013.01); *H01L 31/115* (2013.01); *G21G 4/00* (2013.01)

(58) Field of Classification Search
CPC ... G21H 1/04; G21H 1/06; G21G 1/04; H01L 27/14; H01L 31/115
(Continued)

(56) References Cited

U.S. PATENT DOCUMENTS 5,859,484 A * 1/1999 Mannik ................ G21H 1/06
310/303
6,479,920 B1 * 11/2002 Lal .......................... G21H 1/00
376/320
(Continued)

FOREIGN PATENT DOCUMENTS

DE 102010004923 A1 7/2011

OTHER PUBLICATIONS

Chandrashekhar et al., "Demonstration of a 4H SiC Betavoltaic Cell", Applied Physics Letters, 2006, 4 pages, vol. 88, No. 033506.
(Continued)

*Primary Examiner* — Jack W Keith
*Assistant Examiner* — Daniel Wasil
(74) *Attorney, Agent, or Firm* — Thompson Coburn LLP; Steven M. Ritchey

(57) ABSTRACT

A method of producing an integrated circuit-type active radioisotope battery, the method comprising exposing at least a portion of an electronically functional, unactivated integrated circuit-type battery to radiation to convert transmutable material in the unactivated battery to a radioisotope thereby producing an active cell and thus the integrated circuit-type active radioisotope battery.

20 Claims, 7 Drawing Sheets

(51) Int. Cl.
*G21H 1/06* (2006.01)
*H01L 31/115* (2006.01)
*H01L 27/14* (2006.01)
*G21G 4/00* (2006.01)

(58) Field of Classification Search
USPC .......... 376/156, 320, 321; 136/202; 310/303
See application file for complete search history.

(56) References Cited

U.S. PATENT DOCUMENTS

| | | | |
|---|---|---|---|
| 6,911,711 B1 | 6/2005 | Shimabukuro et al. | |
| 2010/0233518 A1* | 9/2010 | Kwon | G21H 1/06 |
| | | | 429/7 |
| 2012/0177166 A1* | 7/2012 | Seidel | G21C 17/10 |
| | | | 376/254 |
| 2013/0083879 A1* | 4/2013 | Heibel | G21H 1/04 |
| | | | 376/153 |
| 2014/0021826 A1 | 1/2014 | Zafiropoulo et al. | |
| 2014/0021827 A1 | 1/2014 | Noyes | |

OTHER PUBLICATIONS

Duggirala et al., "3D Silicon Betavoltaics Microfabricated Using a Self-Aligned Process for 5 Milliwatt/CC Average, 5 Year Lifetime Microbatteries", The 14th International Conference on Solid-State Sensors, Actuators and Microsystems, pp. 279-282, 2007.

Eiting et al., "Demonstration of a Radiation Resistant, High Efficiency SiC Betavoltaic", Applied Physics Letters, 2006, 4 pages, vol. 88, No. 064101.

Guo et al, "Nanopower Betavoltaic Microbatteries", The 12th International Conference on Solid State Sensors, Actuators and Microsystems, pp. 36-39, 2003.

International Search Report and Written Opinion for PCT/US2015/025585 dated Jul. 17, 2015.

Qiao et al., "A Micro Nuclear Battery Based on SiC Schottky Barrier Diode", Microelectromechanical Systems, Journal of Systems, Jun. 2011, pp. 685-690, vol. 20, No. 3.

Qiao et al., "Demonstration of a 4H SiC Betavoltaic Nuclear Battery Based on Schottky Barrier Diode", Chinese Physics Letters, 2008, pp. 3798-3800, vol. 25, No. 10.

Rappaport, "The Electron-Voltaic Effect in r-h Junctions Induced by Beta-Particle Bombardment", American Physical Society, Jan. 1954, pp. 246-247, vol. 93, Issue 1.

* cited by examiner a – substrate
b – powder/liquid with transmutable material
c – metal
d – metal or semiconductor film

MASS PRODUCTION METHOD OF LOADING RADIOISOTOPES INTO RADIOVOLTAICS

CROSS-REFERENCE TO RELATED APPLICATIONS

The present application is a U.S. National Phase application of PCT/US2015/025585, filed on Apr. 13, 2015, claiming the benefit of U.S. Provisional Application No. 61/995, 496, filed on Apr. 11, 2014, both of which are incorporated herein by reference in their entireties.

FIELD OF THE INVENTION

The manufacture of radiovoltaic devices, generally. More particularly, the manufacture of radiovoltaic devices utilizing various techniques associated with the manufacture of integrated circuit devices combined with certain radioisotope activation techniques.

BACKGROUND OF INVENTION

By virtue of the tremendous benefits from micro/nanotechnology, implantable and portable devices/systems have become more and more prevalent. However, a major impediment for operating such devices/systems is lack of sustainable and reliable power sources in small scale. Chemical batteries and fuel cells are very bulky and heavy, and can offset the size advantage inherent in micro/nanofabrication technologies. Major disadvantages of using chemical based power sources are the low power density of the fuels as the size of the systems is reduced and the poor performance when they are designed to achieve longer lifetimes. In addition, the requirement of frequent recharging or refueling is an inconvenience and is not favorable for many applications including biomedical implants, space exploration, etc. Instead, solar cells can produce electrical power in a small package without refueling processes and operate in most environments where micro-scale power sources are desired. However, sun-light is always required. Various energy harvesters, which generate electrical power from stray energy like heat and vibration, are simply too weak and provide irregular levels of electric power.

In contrast to the aforementioned power sources, nuclear or radioisotope batteries can provide long lasting power at very high energy density. Radioisotope batteries are devices which convert energy from the decay of radioisotopes into electrical power. These devices come in two varieties: direct conversion and indirect conversion. Direct conversion devices convert the radioactive energy directly to electrical energy via direct-charge generation in dielectrics via ionization or, more commonly, electron-hole pair generation in a semiconductor via excitation or ionization. Indirect conversion devices convert the radioactive energy into an intermediary form of energy, usually photonic or thermal, and convert the intermediary energy form to electricity. Indirect conversion is less efficient but tends to mitigate radiation damage to certain battery components. For any type of radiovoltaic, a radioisotope must be included, as its decay products supply the energy. Thus far, radiovoltaic batteries have been produced by fabricating a device for converting the decay product energy (e.g., semiconductor p-n junction) followed by attaching a radioisotope by hand or electroplating. With these methods, process control is naturally very poor. Radioactive waste is generated as a byproduct of fabrication and human handling of radioactive material is often necessary. Moreover, shortcomings of these cumbersome fabrication processes place strict limitations on the physical dimensions and mass production feasibility of radioisotope batteries. Likewise, the ability to integrate such devices directly into electronic circuitry is limited.

The concept of voltaic cells powered by radioactive decay was first introduced in the late 1950s [1]. A radioisotope (typically a beta-emitter, but sometimes an alpha-emitter) emits radiation that energizes a semiconductor upon impact. When the semiconductor is energized, electron-hole pairs are generated and separated by a built-in electric field due to a p-n or Schottky junction. Betavoltaics and alphavoltaics are similar to solar cells except they use energy from radioactive decay instead of energy from the sun. Because radioactive decay is unaffected by temperature and pressure, a radioisotope micro-power source can operate for extended periods of time and in extreme environments. More importantly, because the energy change in radioactive decay is $10^4$ to $10^6$ times greater than that of a chemical reaction, the energy density (J/kg) of radioactive material is approximately $10^6$ times greater than that of lithium ion batteries [2]. However, it is not easy to increase the capacity due to difficult handling and processing technologies for radioactive materials.

Although nuclear batteries or radioisotope batteries or radiovoltaic batteries or atomic cells have been regarded as promising power sources, their adoption has been extremely limited. Additionally, although the radiovoltaic nuclear battery has been around for about 50 years, the structural design of nuclear batteries has gone relatively unchanged. Instead, nearly all efforts have focused on efficiency and/or lifetime improvement. Researchers have continually attempted to modify the topography of nuclear batteries to improve the directionality of harvesting, thereby increasing efficiency [3], [4]. In addition, radiation-resistant materials such as SiC and Se—S composites have been investigated for their ability to withstand damage to manufacture longer lasting batteries [5-8]. While efficiency continues to improve, the low total power density of nuclear batteries still limits them to niche applications. The current power density of nuclear batteries falls far short of the expectations imposed by the technology's reputation for extreme energy density. Consequently, the applications of nuclear batteries have shifted to almost exclusively micro-scale low consumption devices. In order to transition to widespread use, the issue of power density must be seriously addressed.

While a number of conversion schemes have been developed and introduced thusfar, conventional types of the nuclear battery design have not changed. Specifically, individual cells on thick semiconductor substrates with external radioisotope thick-films are the norm. With this standard fabrication method, battery expansion can only be done laterally or by vertically combining multiple thick substrates. Lateral expansion is undesirable because the lateral dimensions of the device are almost always the largest, leaving little room to expand while still maintaining a small profile. Vertical expansion by combining multiple substrates quickly transitions from micro-scale to macro-scale where the substrates are typically about 300 µm thick. Bonding them together and electrically connecting them also introduces new levels of complexity and difficulty in design and processing. Thus, power density and expansion capabilities are greatly limited.

In addition, nuclear battery fabrication is greatly encumbered by safety hazards and governmental regulations related to human handling of hazardous radioisotope materials. As a result, the fabrication of nuclear batteries remains very complicated, time consuming, and resistant to automation. To avoid hazards presented by vapor-deposition of radioisotopes, nuclear batteries are typically powered by external foils or electroplated thick-films. Introduction of these sources is carried out by hand, and is both hazardous and limiting. Governmental regulations, as well as in-house regulations by health physics committees limit the personnel who can perform these actions and the methods by which they can be done. In addition, attaching external sources to conversion devices is another challenge, and researchers often neglect to address this step [1], [3], and [5]-[8]. This would certainly have to be done by hand, and would be nearly impossible to accomplish on purely micro-scale levels. In addition, post-fabrication attachment of a radioisotope to the device also limits and complicates integration with other technologies.

If nuclear batteries are to be truly integrated with other micro/nano technologies, new methods of fabrication and radioisotope loading must be considered. In view of the foregoing, a need still exists for a method of manufacturing radioisotope batteries that allow for one or more of the following: increased or total automation, decreased battery dimensions, improved precision, improved process control, improved safety, reduced or eliminated production of radioactive water, and improved integration with electronic circuitry.

SUMMARY OF INVENTION

One embodiment of the present invention is directed to a method of producing an integrated circuit-type active radioisotope battery, the method comprising exposing at least a portion of an electronically functional, unactivated integrated circuit-type battery that is either on a substrate or comprises the substrate, wherein the unactivated integrated circuit-type battery comprises an unactivated cell that comprises:
 a conversion device for converting energy from decay products of a radioisotope into electrical energy capable of performing work; and
 a non-radioactive, transmutable material associated with the conversion device;
to radiation to transmute at least a portion of the transmutable material to a radioisotope thereby producing an active cell, wherein the energy from the decay products of the radioisotope material are converted by the conversion device into electrical energy capable of performing work, and the integrated circuit-type active radioisotope battery.

One embodiment of the present invention is directed to an integrated circuit-type active radioisotope battery produced by the method of the immediately preceding paragraph.

One embodiment of the present invention is directed to an electronically functional, unactivated integrated circuit-type battery as described in the above-described method.

One embodiment of the present invention is directed to an integrated circuit-type active radioisotope battery as described in the above-described method.

DETAILED DESCRIPTION OF INVENTION

One embodiment of the invention involves the use of micro- and nano-scaled fabrication techniques, usually associated with the production of integrated circuits (e.g., on silicon wafers), to fabricate an electronically functional but unactivated, radioisotope precursor-containing battery that is activated post-fabrication by irradiation. By fabricating the battery using non-radioactive materials, standard microfabrication techniques or virtually any other techniques may be used.

Another embodiment is directed to unactivated integrated circuit-type radioisotope precursor-containing batteries. Yet another embodiment is directed to activate integrated circuit-type radioisotope batteries. Advantageously, the present invention may allow for one or more of the following benefits to be realized: increased or total automation, decreased battery dimensions, improved precision, improved process control, improved safety, reduced or eliminated production of radioactive hazardous waste, and improved integration with electronic circuitry.

This means production-line processing, mass production, and concurrent processing with electronic circuitry are all possible. After the fabrication process is complete, non-radioactive material on the devices are "activated" by exposure to radiation, which transmutes stable isotopes in the devices into desired radioisotopes. The finished product will turn into a working radiovoltaic cell, which may or may not be already integrated into circuitry. Advantageously, the method allows for circumventing the hazards and complications associated with human handling of radioisotopes. Additionally, it is possible to decrease dimensions of radioisotope definition on substrates, and therefore allows radiovoltaics to be easily integrated with other electronic devices. The streamlined approach to deposition, along with the expanded dimensional capabilities allow for mass production of integrated radiovoltaic and electronic devices.

Another advantage of post-fabrication activation is that it allows a variety of materials and techniques to be applicable. For example, film deposition techniques such as sputtering, evaporation, electroplating, electroless plating, and chemical vapor deposition may be used to incorporate various device materials, including transmutable materials, into the device. Further, the substrate itself may include transmutable materials. The transmutable ("radioisotope-to-be") material(s) may be located/positioned/place essentially anywhere in the device. For example, the transmutable material(s) may be beneath, on-top of, or near the converting device or circuitry. Likewise, any shape is possible, as these layers may be patterned using standard photolithography, lift-off, or shadowmasks.

Figure 1:
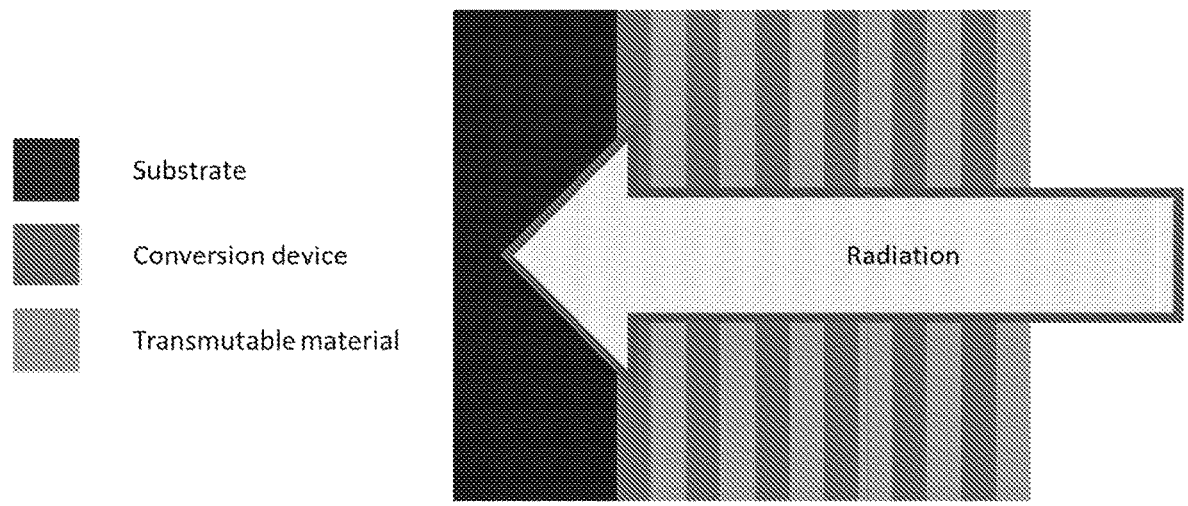
FIG. 1 is a schematic diagram of the activation of a stacked radioisotope battery.
Figure 5:
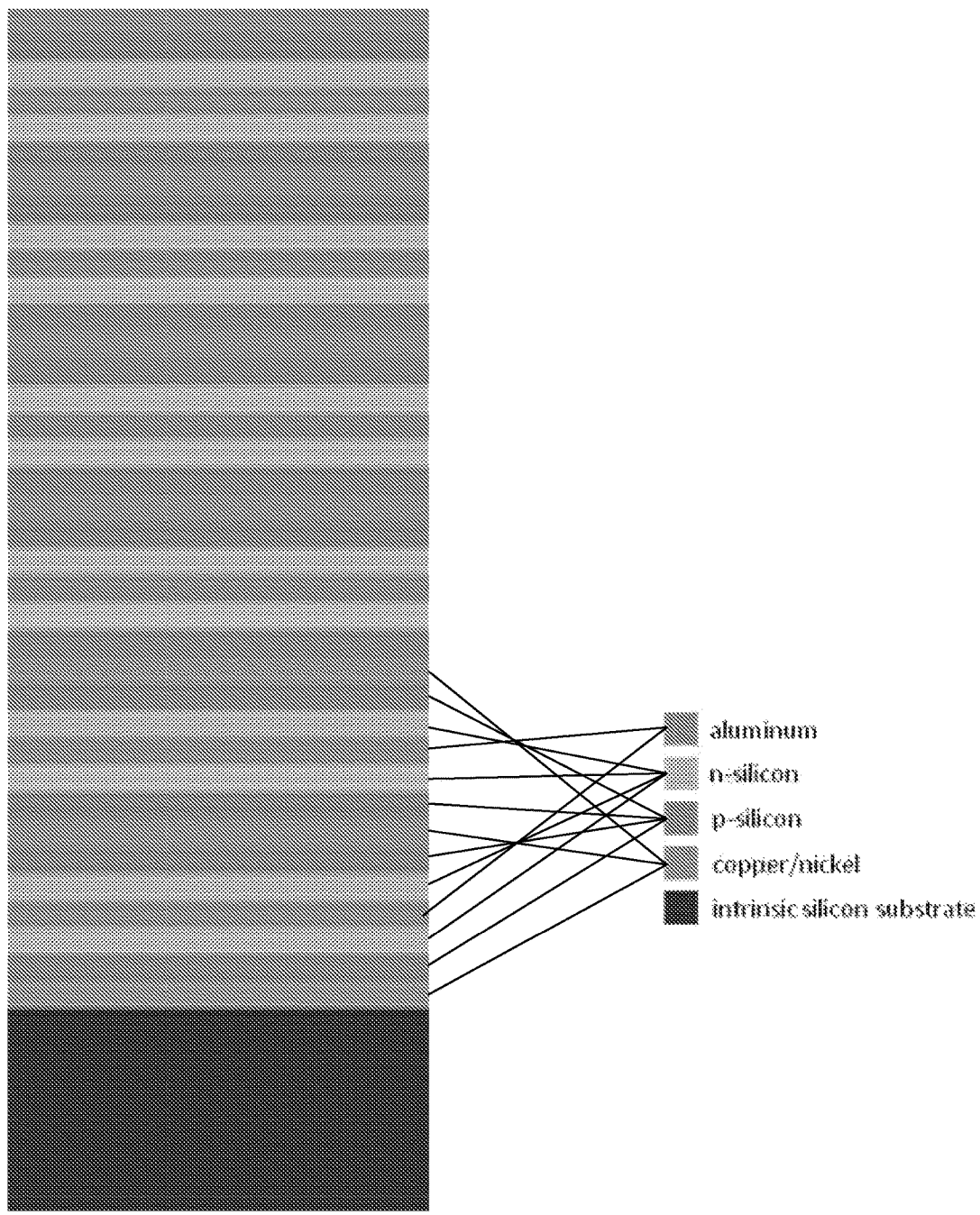
FIG. 5 is a schematic diagram of a 12-stacked cell silicon thin-film p-n structure embodiment of a betavoltaic device.

Yet another advantage of the present method(s) is that multiple cells and/or multiple batteries may be fabricated and simultaneously activated. For example, many layers of transmutable material(s) may be sandwiched in between p-n, p-i-n, or Schottky junctions, as well as indirect conversion devices in a stacked or vertical manner. Radiation can then penetrate the entire structure, primarily activating the intended materials to generate radioisotopes, as seen in FIGS. 1 and 5.

Method of Producing an Integrated Circuit-Type Active Radioisotope Battery

In one embodiment, the method of producing an integrated circuit-type active radioisotope battery comprises exposing at least a portion of an electronically functional, unactivated integrated circuit-type battery that is either on a substrate or comprises the substrate, wherein the unactivated integrated circuit-type battery comprises an unactivated cell that comprises:
    a conversion device for converting energy from decay products of a radioisotope into electrical energy capable of performing work; and
    a non-radioactive, transmutable material associated with the conversion device;
to radiation to transmute at least a portion of the transmutable material to a radioisotope thereby producing an active cell, wherein the energy from the decay products of the radioisotope material are converted by the conversion device into electrical energy capable of performing work, and the integrated circuit-type active radioisotope battery.

In yet another embodiment, the method of producing an integrated circuit-type active radioisotope battery comprises exposing the above-described electronically functional, unactivated integrated circuit-type battery to radiation to transmute the transmutable material to a radioisotope thereby producing an active cell, wherein the energy from the decay products of the radioisotope material are converted by the conversion device into electrical energy capable of performing work, and the integrated circuit-type active radioisotope battery.

Transmutable Material, Radiation, Radioisotope, and Decay Products

In one embodiment, the transmutable material is selected from the group consisting of $^{63}$Cu, $^{64}$Ni, $^{62}$Ni, $^{6}$Li, $^{146}$Nd, $^{209}$Bi, $^{31}$P, $^{45}$Sc, $^{44}$Ca, $^{88}$Sr, $^{89}$Y, $^{148}$Sm, $^{150}$Sm, $^{203}$Tl, $^{204}$Hg, $^{110}$Pd, $^{109}$Ag, $^{124}$Sn, $^{59}$Co, and combinations thereof. Several sources for irradiation can be used with this method, including neutrons of any energy (cold, thermal, slow, fast, etc.) from a nuclear reactor, fusion system, or spallation neutron source, or ions from a particle accelerator (protons, deuterons, tritons, alpha particles, and combinations thereof.

The resulting radioisotope is selected from the group consisting of $^{64}$Cu, $^{63}$Ni, $^{3}$H, $^{147}$Pm, $^{208}$Po, $^{210}$Po, $^{32}$P, $^{33}$P, $^{46}$Sc, $^{45}$Ca, $^{89}$Sr, $^{90}$Sr, $^{90}$Y, $^{151}$Sm, $^{204}$Tl, $^{148}$Eu, $^{148}$Gd, $^{110}$Ag, $^{111}$Ag, $^{124}$Sb, $^{125}$Sb, $^{60}$Co, and combinations thereof, and the decay products are α particles, β particles, γ rays, and combinations thereof.

In another embodiment, the transmutable material and the radiation are selected to yield a β-emitting or an α-emitting radioisotope.

In yet another embodiment, the transmutable material, the radiation, the radioisotope, and the decay products are selected from one or more of the reactions set forth in the following table:

| Transmutable Material | + | Radiation | → | Radioisotope | Decay Products |
|---|---|---|---|---|---|
| $^{63}$Cu | + | deuteron or neutron | → | $^{64}$Cu | β particles, γ rays |
| $^{64}$Ni | + | proton | → | $^{64}$Cu | β particles, γ rays |
| $^{62}$Ni | + | neutron | → | $^{63}$Ni | β particles |
| $^{6}$Li | + | neutron | → | $^{3}$H | β particles |
| $^{146}$Nd | + | neutron | → | $^{147}$Pm ($^{146}$Nd is transmuted to $^{147}$Nd, which beta decays to $^{147}$Pm) | β particles, γ rays |
| $^{209}$Bi | + | neutron | → | $^{210}$Po ($^{209}$Bi is transmuted to $^{210}$Bi, which beta decays to $^{210}$Po) | α particles, γ rays |
| $^{209}$Bi | + | proton | → | $^{208}$Po | α particles, γ rays |
| $^{31}$P | + | neutron | → | $^{32}$P, $^{33}$P | β particles |
| $^{45}$Sc | + | deuteron or neutron | → | $^{46}$Sc | β particles, γ rays |
| $^{44}$Ca | + | deuteron or neutron | → | $^{45}$Ca | β particles, γ rays |
| $^{88}$Sr | + | deuteron or neutron | → | $^{89}$Sr, $^{90}$Sr | β particles, γ rays |
| $^{89}$Y | + | deuteron | → | $^{90}$Y | β particles, γ rays |
| $^{150}$Sm | + | deuteron or neutron | → | $^{151}$Sm | β particles, γ rays |
| $^{203}$Tl | + | deuteron | → | $^{204}$Tl | β particles |
| $^{204}$Hg | + | deuteron | → | $^{204}$Tl | β particles |
| $^{209}$Bi | + | deuteron | → | $^{208}$Po, $^{210}$Po | α particles, γ rays |

-continued

| Transmutable Material | + | Radiation | → | Radioisotope | Decay Products |
|---|---|---|---|---|---|
| $^{148}$Sm | + | deuteron | → | $^{148}$Eu | β particles, γ rays, α particles |
| $^{148}$Sm | + | deuteron | → | $^{148}$Gd ($^{148}$Sm is transmuted to $^{148}$Eu, which beta decays to $^{148}$Gd) | α particles |
| $^{110}$Pd | + | deuteron or proton | → | $^{110}$Ag, $^{111}$Ag | β particles, γ rays |
| $^{109}$Ag | + | deuteron or neutron | → | $^{110}$Ag | β particles, γ rays |
| $^{124}$Sn | + | Deuteron or proton | → | $^{124}$Sb, $^{125}$Sb | β particles, γ rays |
| $^{59}$Co | + | deuteron or neutron | → | $^{60}$Co | β particles, γ rays |

As can be seen, the present invention allows for significant variability in the selection of transmutable material, radiation, radioisotope, and decay products. Additionally, the present invention allows for variability in selecting the location or locations of the transmutable material(s). For example, transmutable material may be located in a substrate and/or one or more layers, films, or deposits on a substrate. The variability is further exemplified by the following description of various particular embodiments.

Film/Layer or Substrate Embodiments

In another embodiment, the transmutable material is $^{63}$Cu present in natural copper and the radiation are selected to yield $^{64}$Cu a β-emitting radioisotope using accelerated deuterons. In another embodiment, $^{64}$Ni is transmuted into $^{64}$Cu using proton irradiation. Advantageously, the transmutable materials for yielding $^{64}$Cu may relatively easily and inexpensively deposited/formed using electroplated or electroless plating or provided as metal substrates.

In another embodiment, the transmutable material is $^{62}$Ni, which may, for example, be deposited/formed in a layer/film of nickel enriched with $^{62}$Ni. The $^{62}$Ni is activated by exposure to neutron irradiation to result in radioactive $^{63}$Ni. Alternatively, the $^{62}$Ni may be provided as part of a metal substrate.

In another embodiment, the desired radioisotope is $^{3}$H (tritium) and it is produced by irradiating lithium with neutrons or protons. Since tritium is a gas, practicality requires some sort of sealing. As such, in one such embodiment, a crystal matrix such as lithium fluoride or lithium niobate is used to partially seal the tritium thereby preventing it from escaping. Additionally, a sealant may be applied over the lithium compound source to prevent tritium gas from escaping after transmutation. For example, parylene thin films or common CVD materials such as silicon oxide, silicon nitride, and polysilicon may be used as sealants over lithium or lithium-compound substrates, films, or nanostructures before irradiation. Advantageously, lithium alloys may be inexpensively deposited/formed using electroplated or electroless plating.

In another embodiment the radioisotope is $^{147}$Pm generated from neutron irradiation of $^{146}$Nd to transmute it into $^{147}$Nd, which rapidly beta decays to $^{147}$Pm. The $^{146}$Nd may, for example, present in the form of a layer/film enriched with $^{146}$Nd. Alternatively, the $^{146}$Nd may be present in a substrate.

Powder or Liquid Embodiments

In another embodiment, the transmutable materials are mixed into powder or liquid composition, preferably a semiconductor composition, before irradiation. For example, bismuth powder may be mixed with selenium and sulfur in a sealed device. Upon irradiation with neutrons, $^{209}$Bi will transmute to $^{210}$Bi, which will beta decay to $^{210}$Po. The result is a powder semiconductor device (liquid upon heating) containing radioisotope mixed therein. Many powder materials, including nanomaterials, may be transmuted in this way. In such an embodiment, it is preferable for the activation cross-section for the desired transmutation to exceed that of the operating semiconductor. Essentially any of the aforementioned transmutable materials may be included into a powder or liquid semiconductor in this manner. That said, this embodiment is particularly advantageous when the desired transmutable material is not readily deposited as a film or layer or incorporated into a substrate. For example, difficulties in depositing lithium make this powder/liquid embodiment an excellent option for transmuting lithium into tritium. Additionally, this powder/liquid embodiment also applies to incorporating transmutable material(s) into organic liquids, polymers, and gels.

Dopant Embodiments of a Semiconductor Substrate or Layer

In another embodiment, dopant(s) in a semiconductor is/are the transmutable material(s). For example, radioactive $^{32}$P and $^{33}$P are produced from neutron irradiation of the $^{31}$P present in phosphorus-doped silicon substrate or layer.

Polymer Embodiments

In another embodiment, one or more of the aforementioned transmutable materials are incorporated into a polymer matrix, which may, for example, be formed or deposited as a layer of the battery.

Location of the Transmutable Material Relative the Conversion Device

As indicated above, the non-radioactive, transmutable material is associated with the conversion device such that upon being activated/transmuted into the radioisotope, the decay products of the radioisotope contact/interact with the conversion device and their energies are converted into electrical energy capable of performing work. The present invention allows for significant variability in the locations/positions of the transmutable material and the conversion device. For example, in one embodiment, the transmutable material is located in a layer adjacent the conversion device. In another embodiment, the transmutable material is not adjacent to the conversion device but sufficiently near to allow for the decay products to travel to the conversion device and be converted to electrical energy. In yet another embodiment, the transmutable material is located in a substrate. In still another embodiment, the transmutable material is located in the conversion device. In yet another embodiment, the transmutable material may be located in one or more combinations of a layer adjacent and/or near the conversion device, the substrate, and/or the conversion device.

Substrate

As indicated above, the unactivated integrated circuit-type battery is either on a substrate or comprises the substrate (i.e., the substrate provides a battery function in addition to being the support or base). For example, in addition to being a support, the substrate may also act as, or be a component of, a semiconductor, an electrode, a p-n junction, a Schottky junction, and/or transmutable material. This, of course, also contributes to the high degree of variability that may be realized with the present invention.

The substrate comprises a substrate material that is appropriate for the particular application. For example, the substrate material may be polycrystalline, a single crystalline, or amorphous. If the substrate is also providing a function such as being a semiconductor, it may be desirable for certain applications to select an amorphous material because they tend to be more resistant to being damaged by radiation.

In one embodiment, the substrate component comprises a substrate material selected from the group consisting of glass, Si, plastic, and metals and alloys thereof, and combinations of the foregoing. In another embodiment, the substrate comprises a substrate material selected from the group consisting of a semiconductor material, metal dielectric material, and combinations thereof.

In one embodiment, the semiconductor material is a large band gap semiconductor material. The large band gap semiconductor material may be selected from the group consisting of $TiO_2$, Si, SiC, GaN, GaAs, ZnO, $WO_3$, $SnO_2$, $SrTiO_3$, $Fe_2O_3$, CdS, ZnS, CdSe, GaP, $MoS_2$, ZnS, $ZrO_2$, and $Ce_2O_3$, and combinations thereof. Additionally, the semiconductor material may be polycrystalline. Alternatively, the semiconductor may be a single crystal.

In another embodiment, the substrate is a doped or undoped single crystal silicon wafer. The single crystal silicon wafer may be of any appropriate size. For example, the single crystal silicon wafer may have a nominal thickness of 300 μm and a nominal diameter selected from the group consisting of 100 mm, 200 mm, 300 mm, and 450 mm.

Conversion Device

As indicated above, the conversion device is converting energy from decay products of a radioisotope into electrical energy capable of performing work. The present invention allows for customization of the particular conversion device depending upon the needs or specifications of the application. For example, the conversion device may be an indirect conversion device. Alternatively, the conversion device may be a direct conversion device. In fact, it is possible for the battery to comprise an indirect conversion device and a direct conversion device.

Although allowing for variability, the present invention is particularly suited for direct conversion-type nuclear batteries. As such, in one embodiment, the conversion device is a direct conversion device that comprises a first electrode, a second electrode, and a rectifying junction-containing component between and in ohmic contact with the first and second electrodes. In particular, each of the first electrode and the second electrode comprises an ohmic metal or metalloid that is independently selected from the group consisting of Al, Ag, Ti, Ni, Au, Fe, Cr, Pt, Pb, Mo, Cu, and highly-doped silicon, alloys thereof, and combinations of the foregoing elements and/or alloys. Further, each of the first electrode and the second electrode have a thickness independently selected from a range of about 50 nm to about 10,000 nm. In one embodiment, the thicknesses of the first electrode and the second electrode layer are substantially the same (e.g., about 200 nm).

Not only does the present invention allow for significant variability in the locations/positions of the transmutable material and the conversion device as indicated above, the present invention also allows for significant variability in the location of the transmutable material within the conversion device in such embodiments. For example, the transmutable material may be located in one or both electrode layers and/or the rectifying junction-containing component.

Rectifying Junction-Containing Component

In one embodiment, the conversion device is a direct conversion device comprising a rectifying junction-containing component. Said rectifying junction-containing component may comprise a semiconductor p-n rectifying junction or a Schottky rectifying junction.

Semiconductor p-n Rectifying Junction

In a particular p-n rectifying junction embodiment the direct conversion device comprises a semiconductor p-n rectifying junction formed by the contact of a p-doped Si layer and n-doped Si layer. The thicknesses of the doped layers may be any appropriate thickness but it is typically desirable for them to be sufficiently thin to allow electrons and holes to migrate to the adjacent electrodes thereby contributing to the electrical current to not be so thick as to result in significant recombination of electrons and holes. In general, the p-doped Si layer and the n-doped Si layer each have a thickness independently selected from a range of about 50 nm to about 10,000 nm. More typically, the thicknesses are selected from a range of about 100 nm to about 500 nm (e.g., 200 nm).

In addition to n-type and p-type semiconductor material, the semiconductor material may also be selected from intrinsic semiconductor (i), $n^+$-type semiconductor ($n^+$), and $p^+$-type semiconductor ($p^+$). In view of this, particular combinations thereof that may be used for p-n rectifying junctions include n-p, n-i-p, $n^+$-i-$p^+$, and $n^+$-n-i-p-$p^+$.

Schottky Rectifying Junction

In one embodiment, the direct conversion device comprises a Schottky rectifying junction formed by the contact of a Schottky metal layer in rectifying contact with a Schottky semiconductor, wherein the Schottky semiconductor is either the substrate or a Schottky semiconductor layer. The thickness of a Schottky semiconductor layer is typically in a range of about 50 nm to about 10,000 nm. Likewise, the thickness of a Schottky metal layer is in a range of about 50 nm to about 10,000 nm. More typically, the thicknesses are selected from a range of about 100 nm to about 500 nm (e.g., 200 nm).

In one embodiment, the Schottky metal is selected from the group consisting of Pt, Au, Pd, Fe, Co, Cr, Ni, Ag, Ti, Ru, Cu, Mo, Ir, and Rh, alloys thereof, and combinations of the foregoing metallic elements and/or alloys. Additionally, the Schottky semiconductor (layer or substrate) may be an n-type material, a p-type material, a n+-type material, and/or a p+-type material. In view of this, particular combinations thereof that may be used for Schottky rectifying junctions include n, p, p-$p^+$, and n-$n^+$.

Shielding

Figure 2:
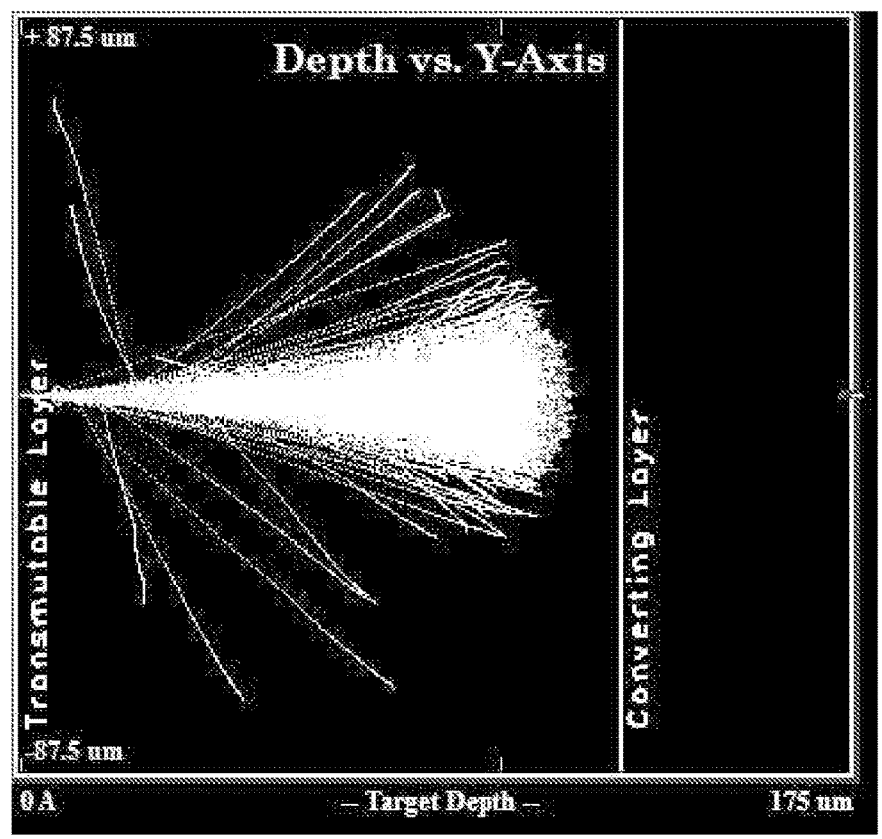
FIG. 2 is a graph showing the trajectory of ions stopping in a transmutable layer before reaching a converting layer.

A transmutable layer may be placed on top of a converting device or circuitry to act as a shield for radiation-sensitive materials. If the transmutable layer is thick enough, it will absorb all of the radiation and prevent radiation damage to other parts of the device, as shown in FIG. 2.

In addition to shielding circuitry or components from the activation radiation by the selection, thickness, and location of transmutable material, the unactivated integrated circuit-type battery may comprise shielding, which allows for transmission of the transmuting radiation but reduces or prevents transmission of the decay products of the radioisotope, and wherein the shielding is free or essentially free of a radioisotope and materials capable of transmuting to a long-lived radioisotope by the exposure to the radiation. Examples of materials suitable for such shielding include W, Au, Pb, Al, Rh, and combinations thereof. Typically, the shielding is of a thickness in a range of about 1000 nm to about 100,000.

Additional Radiation Damage Controls

Although amorphous thin-film junctions are not ideal, the use thereof as part conversion device may be advisable, depending on the application, because amorphous materials tend to be more resistant to radiation damage than crystalline materials. This would likely be best reserved to stacked cell embodiments such as depicted in FIG. 5 and described in more detail below.

Figure 3:
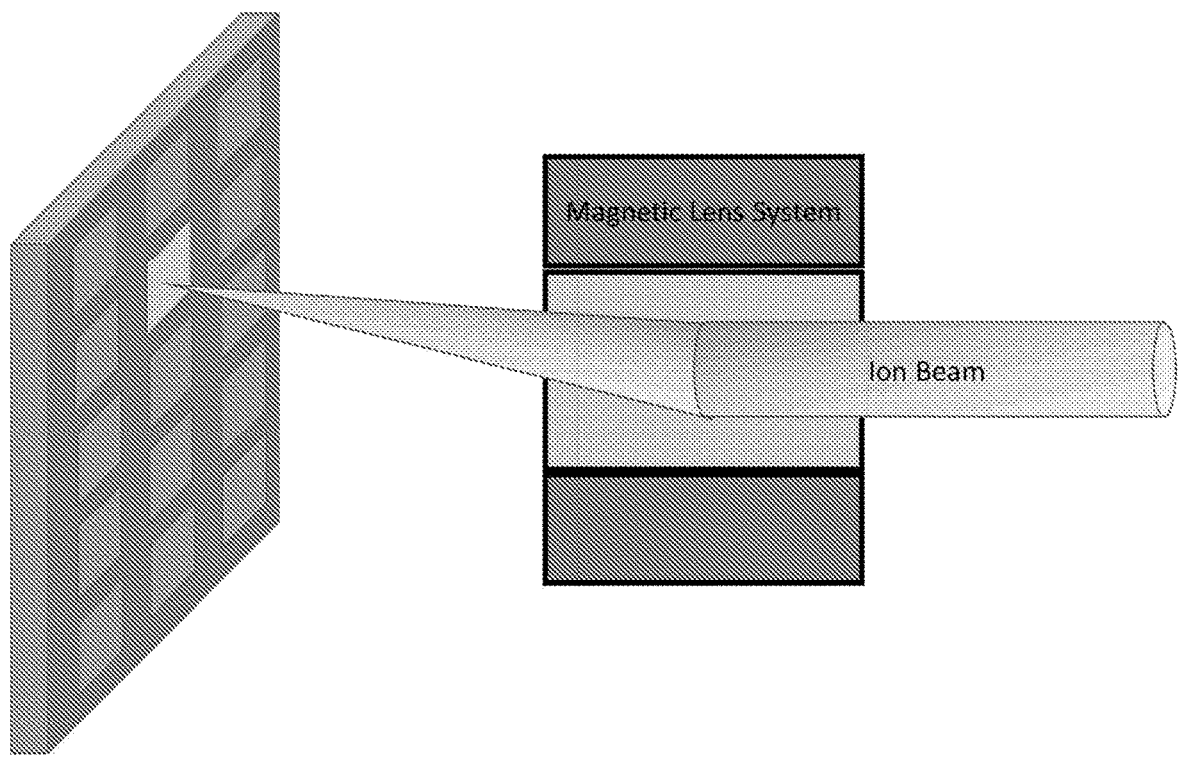
FIG. 3 is a schematic diagram of using beam optics to control ion beam diameter and position on target as part of a selective irradiation.

Additionally, radiation damage to components of the battery and/or associated circuitry may be reduced or eliminated through "selective irradiation," which limits radiation exposure to selected portion(s) of the unactivated battery(ies). Selective irradiation may be accomplished, for example, by controlling the cross-sectional area of the radiation contacting the unactivated battery(ies) and/or controlling the trajectory of the radiation, and/or controlling the relative positions of the source of the radiation and the selected portion(s) of the unactivated battery(ies). One manner of accomplishing the foregoing is to use beam optics to focus on only the desired areas, as shown in FIG. 3. With charged or neutral particle radiation, a narrow radiation beam may be used, while the device is translated in the x & y directions to position the desired areas in the beam path. To focus and control a cyclotron beam, a simple solenoidal magnetic field may be used by, for example, placing two coils exterior to the beam drift tube on opposing sides. The coils provide a transverse magnetic field relative to the direction of the particle beam. The Lorentz force exerts a force orthogonal to both the beam direction and applied magnetic field. By varying the current drive to the coils, the applied magnetic field is varied, the Lorentz force is varied, and the beam may be swept in one dimension. By adding another set of coils, on an axis orthogonal to the first set of coils and the beam direction, a full two dimensional control of the beam is achieved across the irradiation surface of the target.

Figure 4:
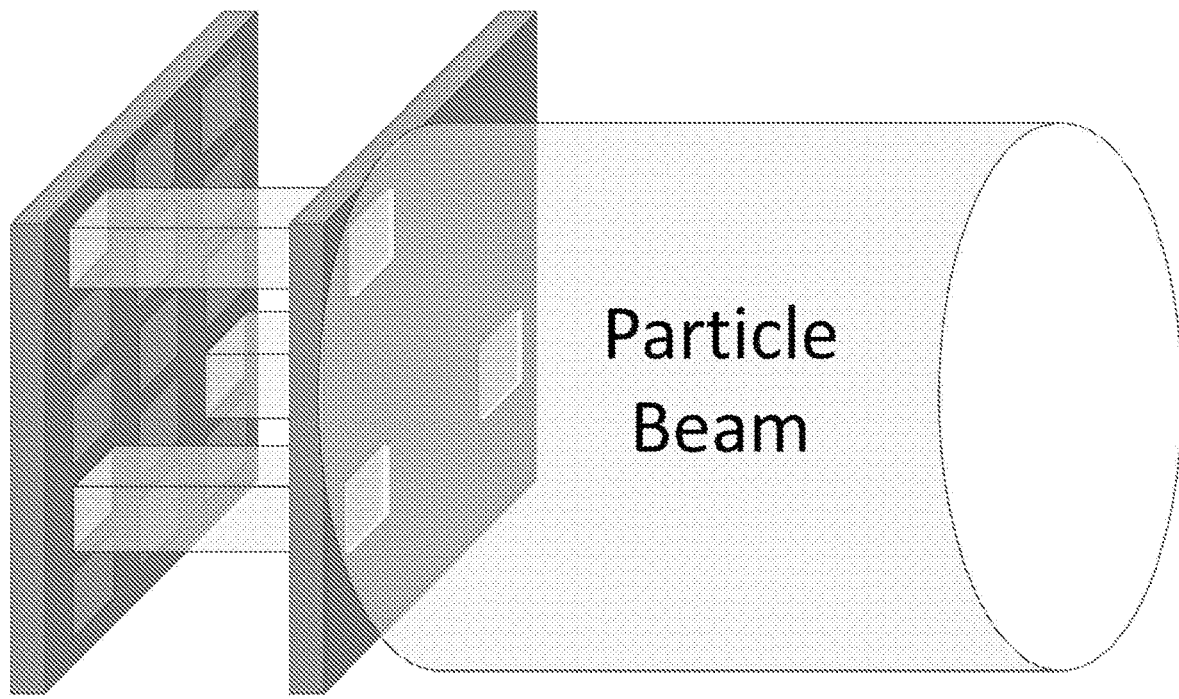
FIG. 4 is a schematic diagram of using a shadowmask to selectively irradiate portions of a target.

In addition or as an alternative to the foregoing one or more shadowmasks may be placed between the radiation source and the unactivated battery(ies) to shield sensitive areas from the radiation as shown in FIG. 4.

Still further, depending upon the application one may be able to activate the battery with thermal neutrons, which tend to be less damaging.

Expanding Capacity

As indicated, energy conversion from radiation requires semiconductors, metals and radioisotope layers, in which the built-in electric field in the semiconductors harvest electron-hole pairs generated by incident radiation, and power is extracted through metallic electrodes. To expand the capacity, multiple cells may be fabricated (using, for example, stacked layers) wherein the electrodes of each cell are connected in series or parallel. In addition to increasing the number of cells of a battery, the present invention allows for the multiple batteries to be connected (in series or parallel). Further, one or more batteries may be connected with one or more integrated circuits. Advantageously, the multiplicity of cells and/or batteries may be activated with a single irradiation.

Further, as previously indicated, the present invention allows for utilizing known integrated circuit manufacturing techniques/methods/technologies which allow for thinner, more precise, smaller dimensional features, which contribute to more capacity and or increased efficiency. For example, using multiple semiconductor thin films rather than thick semiconductor substrates, is believed to contribute to higher conversion efficiency. In a radiovoltaic device, electron-hole pairs (EHPs) can be generated at any point inside the semiconductor, but must diffuse to the depletion region at the p-n or Schottky junction before being separated by the built-in electric field. In the case of a thick semiconductor substrate (approximately 300 μm), the length that EHPs must diffuse to reach the depletion region is often much longer than the average diffusion length, and the energy is simply lost when the electron-hole pair recombines before being separated. A battery with many thin-film semiconductors allows for electron-hole pairs to be generated within one average diffusion length of the depletion region. Plus, providing many layers of radioisotopes sandwiched between semiconductors allows for greater overall efficiency due to isotropic energy harvesting.

In view of the foregoing, in one embodiment the unactivated integrated circuit-type battery comprises a multiplicity of unactivated cells that are activated by the exposure to the radiation. In another embodiment, the unactivated cells are essentially identical. In yet another embodiment, the unactivated integrated circuit-type battery is on the substrate and the multiplicity of unactivated cells are in a stacked arrangement. The unactivated cells may be connected in series, in parallel, or a combination thereof.

Additionally, in one embodiment a multiplicity of batteries (single cell or multiple cell) usually on or comprising a shared substrate (e.g., silicon wafer) are activated while connected via the substrate simultaneously or sequentially. For example, at least portions of a multiplicity of unactivated batteries are exposed to the radiation to transmute at least portions of the transmutable materials associated with each unactivated cell of each unactivated battery to the radioisotopes thereby producing each active cell of each active radioisotope battery thereby yielding a multiplicity of active radioisotope batteries. The unactivated batteries may not be connected or connected in series, in parallel, or a combination thereof. Still further, each unactivated battery or collection of connected unactivated batteries is in electrical connection with one or more integrated circuits on the substrate and, upon being exposed to the radiation, the electrical energy capable of performing work from the active battery or collection of connected electrical batteries powers allows for operation of the one or more integrated circuits. In one embodiment, the one or more integrated circuits are shielded from the radiation by a layer comprising a transmutable material that absorbs all or substantially all of the radiation.

Exemplary Embodiments of Fabrication Processes

Process 1—Thin-Film p-n Junction on Transmutable Substrate

A fabrication process for a thin-film p-n junction on transmutable substrate may comprise the following steps:

a) Start with a substrate of the material which is to be transmuted (e.g., Ni, Cu, Li, Nd, etc.);

b) Deposit a sealing layer on the substrate, if necessary (e.g., Parylene, silicon oxide, polysilicon, silicon nitride, etc.);

c) Deposit an adhesion promoting layer on the substrate by, for example, sputtering or evaporation (e.g., Cr);

d) Deposit an appropriate first ohmic contact (or electrode) layer for the following semiconductor material (e.g., p-type silicon), which may be, for example Pt, by evaporation or sputtering;

e) Deposit an appropriate semiconductor material (e.g., p-type silicon) by, for example, sputtering;

f) Deposit another appropriate semiconductor material (e.g., n-type silicon) by, for example, sputtering;

g) Deposit a second ohmic contact (or electrode) layer appropriate for the preceding semiconductor material (e.g., n-type silicon), which may be, for example Al, by, for example, evaporation or sputtering;

h) Pattern the foregoing assembly with photolithography as desired; and i) Transmute the transmutable material in the substrate using an appropriate/desired irradiation method (e.g., neutrons from nuclear reactor or spallation neutron source; or ions from ion beam).

Process 2—Thin-Film p-n Junction with Transmutable Film

A fabrication process for a thin-film p-n junction with transmutable film may comprise the following steps:

a) Start with an appropriate substrate (e.g., silicon wafer);

b) Deposit an adhesion promoting layer (e.g. Cr) on the substrate by, for example, sputtering or evaporation;

c) Deposit an appropriate first ohmic contact (or electrode) layer for the following semiconductor material (e.g., p-type silicon), which may be, for example Pt, by evaporation or sputtering;

d) Deposit an appropriate semiconductor material (e.g., p-type silicon) by, for example, sputtering;

e) Deposit another appropriate semiconductor material (e.g., n-type silicon) by, for example, sputtering;

f) Deposit a second ohmic contact (or electrode) layer appropriate for the preceding semiconductor material (e.g., n-type silicon), which may be, for example Al, by, for example, evaporation or sputtering;

g) Deposit an appropriate seed layer (e.g., Au, Pt, Cu, Ni, Nd) for electro- or electroless plating on the second ohmic contact layer by, for example, sputtering or evaporation;

h) Pattern the foregoing assembly with photolithography as desired;

i) Deposit a transmutable material layer (e.g., Cu, Ni, Nd, etc.) by electro- or electroless plating; and j) Transmute the transmutable material using an appropriate/desired irradiation method (e.g., neutrons from nuclear reactor or spallation neutron source; or ions from ion beam).

Process 3—Thin-Film Schottky Junction on Transmutable Substrate

A fabrication process for a thin-film Schottky junction on transmutable substrate may comprise the following steps:

a) Start with a substrate of the material which is to be transmuted (e.g., Ni, Cu, Li, Nd, etc.);

b) Deposit an adhesion promoting layer on the substrate by, for example, sputtering or evaporation (e.g., Cr);

c) Deposit an appropriate first ohmic contact (or electrode) layer for the following semiconductor material (e.g., p-type or n-type silicon), which may be, for example Pt, by, for example, evaporation or sputtering;

d) Deposit an appropriate semiconductor material layer (e.g., p-type or n-type silicon) by, for example, sputtering;

e) Deposit an appropriate rectifying metal layer (e.g., Al) on the semiconductor layer for Schottky contact by, for example, evaporation or sputtering;

f) Pattern the foregoing assembly with photolithography as desired; and g) Transmute the transmutable material using an appropriate/desired irradiation method (e.g., neutrons from nuclear reactor or spallation neutron source; or ions from ion beam).

Process 4—Thin-Film Schottky Junction with Transmutable Film

A fabrication process for a thin-film Schottky junction with transmutable film may comprise the following steps:

a) Start with an appropriate substrate (e.g., silicon wafer);

b) Deposit an adhesion promoting layer (e.g. Cr) on the substrate by, for example, sputtering or evaporation;

c) Deposit an appropriate first ohmic contact (or electrode) layer for the following semiconductor material (e.g., p-type or n-type silicon), which may be, for example Pt, by evaporation or sputtering;

d) Deposit an appropriate semiconductor material (e.g., p-type or n-type silicon) by, for example, sputtering;

e) Deposit an appropriate rectifying metal layer (e.g., Al) on the semiconductor layer for Schottky contact by, for example, evaporation or sputtering;

f) Deposit an appropriate seed layer (e.g., Au, Pt, Cu, Ni, Nd) for electro- or electroless plating on the second ohmic contact layer by, for example, sputtering or evaporation;

g) Pattern the foregoing assembly with photolithography as desired;

h) Deposit a transmutable material layer (e.g., Cu, Ni, Nd, etc.) by electro- or electroless plating; and i) Transmute the transmutable material using an appropriate/desired irradiation method (e.g., neutrons from nuclear reactor or spallation neutron source; or ions from ion beam).

Process 5—Stacked Thin-Film p-n Junction Device

A fabrication process for a stacked thin-film p-n device may comprise the following steps:

a) Start with an appropriate substrate (e.g., silicon wafer);

b) Create a lift-off pattern for the radioisotope battery using, for example, photolithography;

c) Deposit an adhesion promoting layer (e.g. Cr) on the substrate by, for example, sputtering or evaporation;

d) Deposit an appropriate first ohmic contact (or electrode) layer for the following semiconductor material (e.g., p-type or n-type silicon), which may be, for example Pt, by evaporation or sputtering;

e) Deposit an appropriate semiconductor material (e.g., p-type silicon) by, for example, sputtering;

f) Deposit another appropriate semiconductor material (e.g., n-type silicon) by, for example, sputtering;

g) Deposit a second ohmic contact (or electrode) layer appropriate for the preceding semiconductor material (e.g., n-type silicon), which may be, for example Al, by, for example, evaporation or sputtering;

h) Deposit a transmutable material layer (e.g., Cu, Ni, Nd, etc.) by, for example sputtering or evaporation;

i) Repeat steps c through h as desired to obtain multiple stacked devices;

j) Remove the lift-off layer, leaving patterned material behind; and k) Transmute the transmutable material using an appropriate/desired irradiation method (e.g., neutrons from nuclear reactor or spallation neutron source; or ions from ion beam).

Process 6—Stacked Thin-Film Schottky Device

A fabrication process for a stacked thin-film Schottky device may comprise the following steps:
a) Start with an appropriate substrate (e.g., silicon wafer);
b) Deposit an adhesion promoting layer (e.g. Cr) on the substrate by, for example, sputtering or evaporation;
c) Deposit an appropriate first ohmic contact (or electrode) layer for the following semiconductor material (e.g., p-type or n-type silicon), which may be, for example Pt, by evaporation or sputtering;
d) Deposit an appropriate semiconductor material (e.g., p-type or n-type silicon) by, for example, sputtering;
e) Deposit an appropriate rectifying metal layer (e.g., Al) on the semiconductor layer for Schottky contact by, for example, evaporation or sputtering;
f) Deposit a transmutable material layer (e.g., Cu, Ni, Nd, etc.) by, for example sputtering or evaporation;
g) Repeat steps c through f as desired to obtain multiple stacked devices;
h) Pattern the foregoing assembly with photolithography as desired; and
i) Transmute the transmutable material using an appropriate/desired irradiation method (e.g., neutrons from nuclear reactor or spallation neutron source; or ions from ion beam).

Process 7—Bulk Semiconductor p-n Junction Device

A fabrication process for a bulk semiconductor p-n junction with transmutable film may comprise the following steps:
a) Start with an appropriate p-type or n-type substrate (e.g., p-type or n-type silicon wafer);
b) Form an insulating layer on the substrate (e.g., thermal oxidation of the substrate to form a $SiO_2$ layer);
c) Pattern the insulating layer using, for example, photolithography, to form a masking layer;
d) Form a layer of oppositely doped material on the unmasked areas of the substrate (e.g., using thermal diffusion or ion implantation to p-dope a region on an n-type silicon wafer or n-dope a region on p-type silicon wafer);
e) Deposit an appropriate ohmic contact (or electrode) layer for the following semiconductor material (e.g., p-type or n-type silicon), which may be, for example Pt, by evaporation or sputtering;
f) Deposit an appropriate seed layer (e.g., Au, Pt, Cu, Ni, Nd) for electro- or electroless plating on the ohmic contact layer by, for example, sputtering or evaporation;
g) Pattern the foregoing metal layers with photolithography to match the previous masking pattern;
h) Deposit a transmutable material layer (e.g., Cu, Ni, Nd, etc.) by electro- or electroless plating; and
i) Transmute the transmutable material using an appropriate/desired irradiation method (e.g., neutrons from nuclear reactor or spallation neutron source; or ions from ion beam).

Process 8—Bulk Semiconductor Schottky Device

A fabrication process for a bulk semiconductor Schottky junction with transmutable film may comprise the following steps:
a) Start with an appropriate p-type or n-type substrate (e.g., p-type or n-type silicon wafer);
b) Deposit an appropriate rectifying metal layer (e.g., Al) on the substrate for Schottky contact by, for example, evaporation or sputtering;
c) Deposit an appropriate seed layer (e.g., Au, Pt, Cu, Ni, Nd) for electro- or electroless plating on the rectifying metal layer by, for example, sputtering or evaporation;
d) Pattern the foregoing assembly with photolithography as desired;
e) Deposit a transmutable material layer (e.g., Cu, Ni, Nd, etc.) by electro- or electroless plating;
f) Deposit an appropriate ohmic contact (or electrode) layer for other side of the substrate;
g) Pattern the ohmic contact layer with photolithography, aligned with the patterned Schottky areas on the front side of the substrate; and
h) Transmute the transmutable material using an appropriate/desired irradiation method (e.g., neutrons from nuclear reactor or spallation neutron source; or ions from ion beam).

Process 9—Powder or Liquid Semiconductor p-n Junction or Schottky Device

Figure 10:
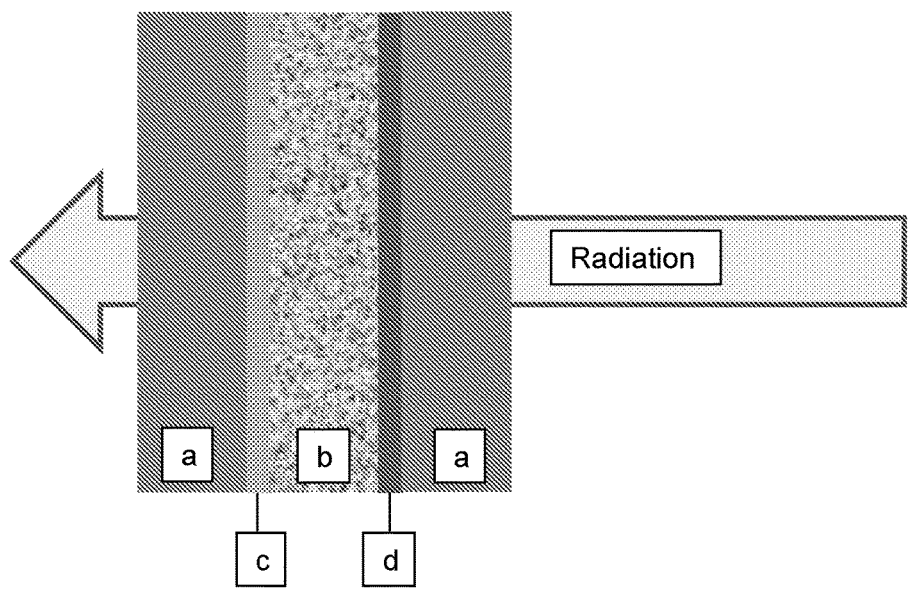
FIG. 10 is a schematic diagram of an embodiment having a powder or liquid semiconductor.

Referring to FIG. 10, a fabrication process for a p-n junction or Schottky device having a powder or liquid semiconductor may comprise the following steps:
a) Start with two appropriate substrate (e.g., silicon wafer);
b) Deposit an appropriate rectifying metal layer (e.g., Al) or semiconductor layer on one of the substrates by, for example, evaporation or sputtering;
  i. a rectifying metal will form a Schottky junction with the powder or liquid semiconductor;
  ii. a semiconductor can form a p-n junction with the powder or liquid semiconductor;
c) Deposit an appropriate ohmic contact (or electrode) layer on the other substrate;
d) If necessary, deposit a matrix or reservoir to retain the powder or liquid semiconductor material on one of the substrates, (e.g., a reservoir may be fabricated by milling a substrate);
e) Placing a powder or liquid mixture comprising semiconductor material and transmutable material between the device-deposited substrates by, for example, manual loading, sol-gel deposition, or dip coating between; and
f) Transmute the transmutable material using an appropriate/desired irradiation method (e.g., neutrons from nuclear reactor or spallation neutron source; or ions from ion beam).

EXAMPLES

Monocrystalline silicon p-n junction wafers were manufactured according to the following steps:
a) Cut a p-type silicon prime wafer to the size of 20.57 mm×20.57 mm using a Disco DAC550 dicing saw. This size is appropriate for placement in the cyclotron sample holder.
b) The cut p-type silicon was cleaned.
  i. First the wafer was cleaned with acetone, methanol, and DI water, in succession (i.e., an AMD wash).
  ii. The AMD wash was followed by a ten minute boil in nitric acid at 90° C. to form a thin oxide layer.
  iii. A rinse with DI water is used to remove residual nitric acid solution.
  iv. A 20 second dip in a solution of hydrofluoric acid, 1:5—$HF:H_2O$, removed the oxide layer.

v. Removal of metallic surface contaminants was achieved by a 2 minute dip in solution of hydrochloric acid and hydrogen peroxide, 3:1:1—HCl:H$_2$O:H$_2$O$_2$.
vi. Removal of the newly formed surface oxide was achieved by a 30 second dip in hydrofluoric acid solution, 1:5—HF:H$_2$O.
vii. The cleaning process was completed with a rinse in DI water to eliminate residual hydrofluoric acid, and the sample is dried with N$_2$.
c) Thermal diffusion of phosphorus atoms into the silicon to form the p-n junction was performed.
i. The thermal diffusion process started with allowing the spin-on-dopant (SOD) to acclimate to room temperature. The SOD was a phosphorous doped spin-on-glass product (P509) from Filmtronics.
ii. 1 milliliter of SOD was dropped on the center of the wafer sample, and spun at 3000 rpm for 15 seconds.
iii. The spin coating was followed by a pre-bake at 200° C. for 10 minutes.
iv. The thermal diffusion occurred in a furnace set at 1000° C. for 1.5 hours, which drives the phosphorous atoms into the bulk silicon. This thermal diffusion process also produced a surface oxide layer, which must be removed prior to electrode deposition.
v. A post-diffusion cleaning removed the surface oxide layer by dipping the wafer in buffered oxide etch (BOE) for 20 seconds.
d) The p-n junction was completed by physical vapor deposition of electrodes on the device, aluminum was sputtered on the n-type silicon, and gold was sputtered on the p-type silicon.

Figure 6:
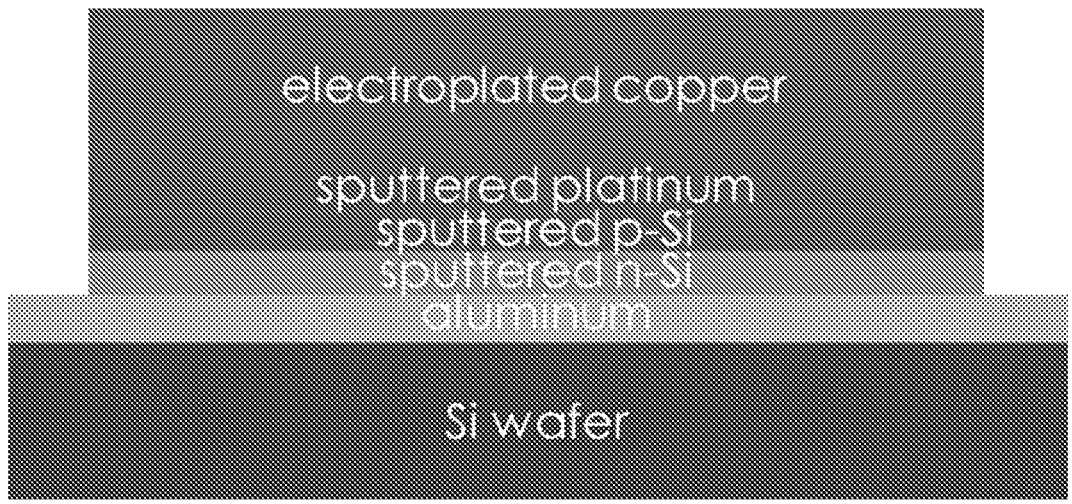
FIG. 6 is a schematic diagram of a silicon thin-film p-n structure embodiment of a betavoltaic device as described in the Example(s) below.
Figure 7:
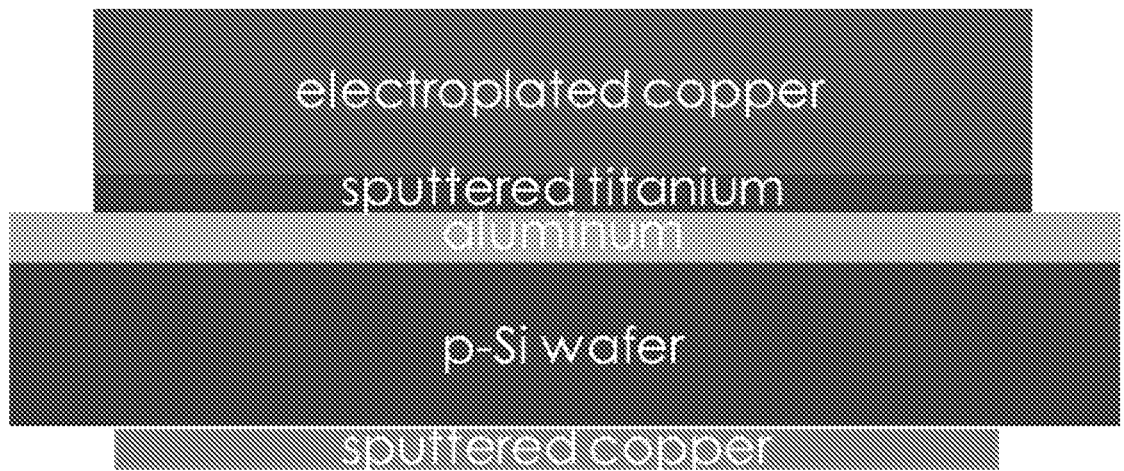
FIG. 7 is a schematic diagram of a crystalline Schottky embodiment of a betavoltaic device as described in the Example(s) below.
Figure 8:
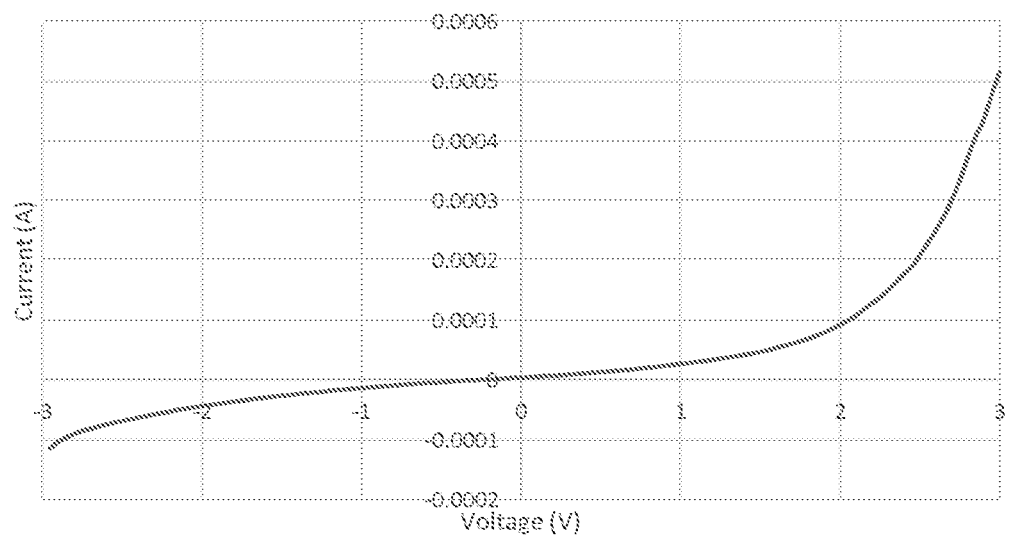
FIG. 8 is a graph of the current-voltage characteristics of the silicon thin-film p-n betavoltaic device as depicted in FIG. 6 and described in the Example(s) below.
Figure 9:
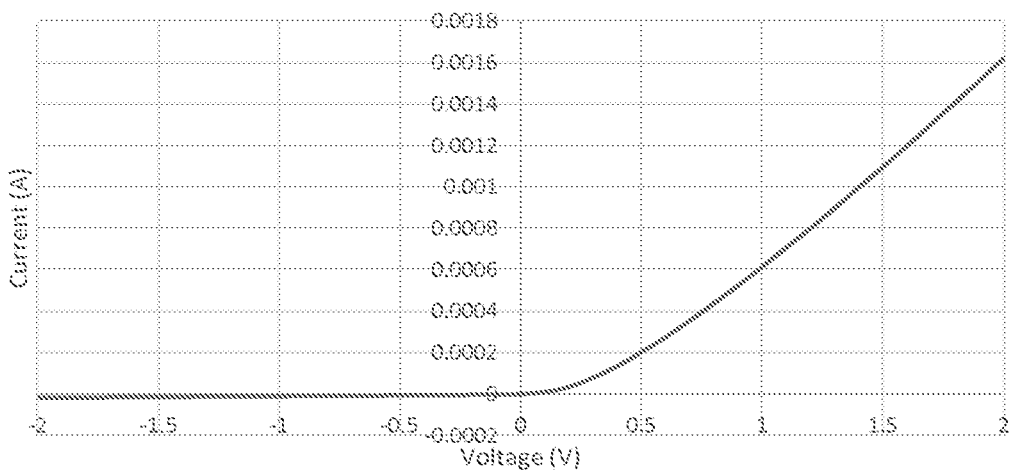
FIG. 9 is a graph of the current-voltage characteristics of the silicon thin-film p-n betavoltaic device as depicted in FIG. 7 and described in the Example(s) below.

Embodiments of the devices were fabricated with thin-film silicon p-n junctions and crystalline Schottky junctions and activated electroplated copper films on top of these devices. The fabrications of silicon p-n and Schottky junctions were accomplished by sputter deposition from p-Si, n-Si, and/or metal targets. In particular, devices as depicted in FIG. 6 were made according to the above-described process 2 for making a thin-film p-n junction with transmutable film. Also, devices as depicted in FIG. 7 were made according to the above-described process 8 for making a bulk semiconductor Schottky device. The radioisotope (activated radionuclides) for both devices was $^{64}$Cu made by electroplating natural copper (69% $^{63}$Cu) and irradiating with 5.7 MeV deuterons from a cyclotron source. After irradiating approximately 10 μm of copper for 4 hours with approximately 40 μA beam current, a well-type radiation counter estimated the presence of approximately 1.37 mCi of $^{64}$Cu on top of a silicon thin-film p-n junction. The current-voltage (I-V) of the devices depicted in FIGS. 6 and 7 are shown in FIGS. 8 and 9, respectively. The nonlinear shapes of these I-V curves indicate a capability to harvest electron-hole pairs generated from incident radiation.

In another experiment, approximately 100 μm of copper was used. Simulation results indicated that this thick copper would stop the deuteron beam before it reached the silicon, as was alluded to previously. In particular, it is possible to position a transmutable layer on top of a converting device or circuitry to act as a shield for radiation-sensitive materials. If the transmutable layer is thick enough, it will absorb all of the radiation and prevent radiation damage to other parts of the device, as shown in FIG. 2. After irradiation, a well-type radiation counter estimated the presence of approximately 1.5 mCi of $^{64}$Cu. The I-V characteristics of the device before and after irradiation did not show any evidence of radiation damage, implying that the deuteron beam did not penetrate into the converting silicon layers. It should be noted that the radioactivity estimated by the well-counter is likely an underestimate due to the system's poor efficiency and the anisotropy of the copper film.

Figure 11:
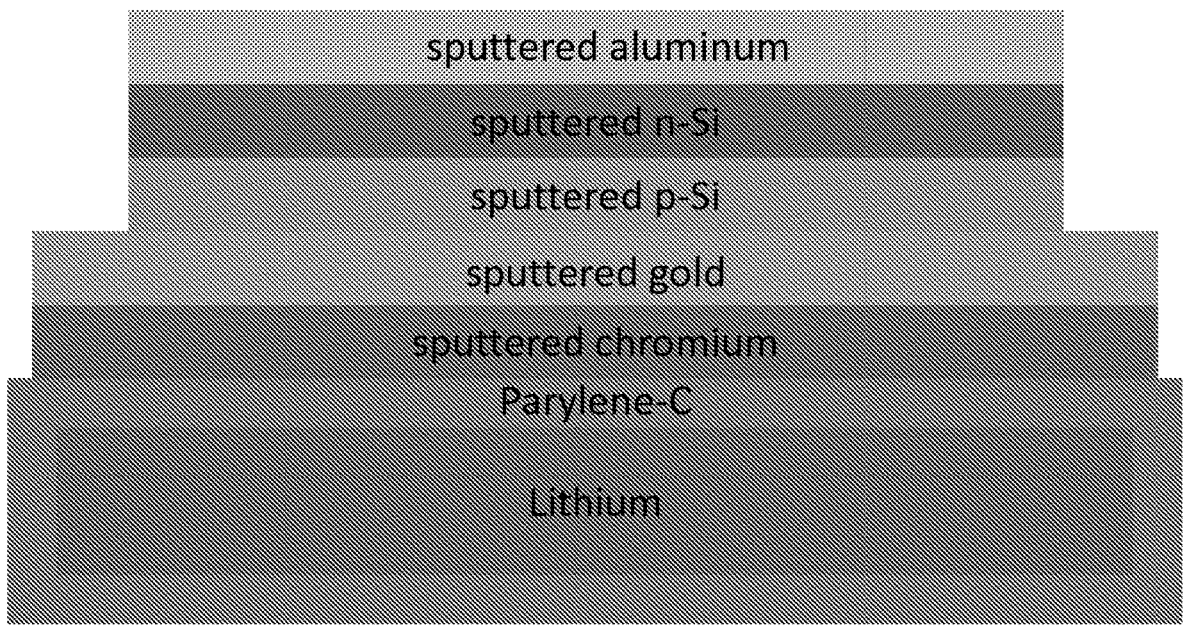
FIG. 11 is a schematic diagram of a silicon thin-film p-n structure embodiment of a p-n betavoltaic device on a parylene-sealed lithium substrate, as described in the Example(s) below.
Figure 12:
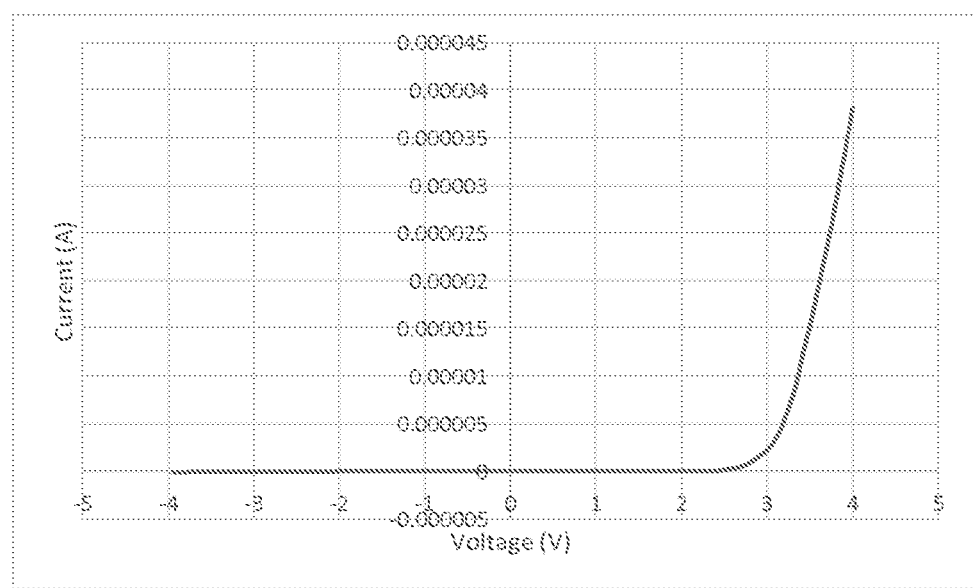
FIG. 12 is a graph of the current-voltage characteristics of a silicon thin-film p-n betavoltaic device as depicted in FIG. 11 and described in the Example(s) below.

Additionally, fabrication of a working rectifying p-n junction on a parylene-sealed lithium substrate has been demonstrated. Parylene was deposited onto a pure lithium substrate for sealing. A silicon thin-film p-n junction was then fabricated on this sealed lithium substrate using the process described previously. A schematic of this device is shown in FIG. 11 and the I-V characteristics of the device are shown in FIG. 12.

Having illustrated and described the principles of the present invention, it should be apparent to persons skilled in the art that the invention can be modified in arrangement and detail without departing from such principles.

Although the materials and methods of this invention have been described in terms of various embodiments and illustrative examples, it will be apparent to those of skill in the art that variations can be applied to the materials and methods described herein without departing from the concept, spirit and scope of the invention. All such similar substitutes and modifications apparent to those skilled in the art are deemed to be within the spirit, scope and concept of the invention as defined by the appended claims.

APPENDIX: REFERENCES

[1] P. Rappaport, "The electron-voltaic effect in p-n junctions induced by beta-particle bombardment," Physical Review, vol. 93, pp. 246-247, 1954.
[2] C. J. Eiting, V. Krishnamoorthy, S. Rodgers, T. George, J. Brockman, and J. D. Robertson, "Demonstration of a Radiation Resistant, High Efficiency SIC Betavoltaic," Applied Physics Letters 88, 064101-1-064101-3 (2006).
[3] H. Guo and A. Lal, "Nanopower betavoltaic microbatteries," 12$^{th}$ International Conference on Solid-State Sensors, Actuators and Microsystems, pp. 36-39, 2003.
[4] R. Duggirala, et al., "3D silicon betavoltaics microfabricated using a self-aligned process for 5 milliwatt/cc average, 5 year lifetime microbatteries," 14$^{th}$ International Conference on Solid-State Sensors, Actuators and Microsystems, pp. 279-282, 2007.
[5] C. Eiting, et al., "Demonstration of a radiation resistant, high efficiency SiC betavoltaic," Applied Physics Letters, vol. 88, p. 064101, 2006.
[6] D. Y. Qiao, et al., "Demonstration of a 4H SiC Betavoltaic Nuclear Battery Based on Schottky Barrier Diode," Chinese Physics Letters, vol. 25, pp. 3798-3800, 2008.
[7] D. Y. Qiao, et al., "A Micro Nuclear Battery Based on SiC Schottky Barrier Diode," Microelectromechanical Systems, Journal of, pp. 1-6, 2011.
[8] M. Chandrashekhar, et al., "Demonstration of a 4H SiC betavoltaic cell," Applied Physics Letters, vol. 88, p. 033506, 2006.

What is claimed is:

1. A method of producing an integrated circuit-type active radioisotope battery, the method comprising exposing at least a portion of an electronically functional, unactivated integrated circuit-type battery that is either on a substrate or comprises the substrate, wherein the unactivated integrated circuit-type battery comprises an unactivated cell that comprises:
a conversion device for converting energy from decay products of a radioisotope into electrical energy capable of performing work; and a non-radioactive, transmutable material associated with the conversion device, wherein the transmutable material is located in one or more of the following: a layer in contact with the conversion device; the substrate; and the conversion device;

to radiation to transmute at least a portion of the transmutable material to a radioisotope thereby producing an active cell, wherein the energy from the decay products of the radioisotope material are converted by the conversion device into electrical energy capable of performing work, thereby producing the integrated circuit-type active radioisotope battery.

2. The method of claim 1, wherein the transmutable material, the radiation, the radioisotope, and the decay products are selected from one or more of the reactions set forth in the following table:

| Transmutable Material | + | Radiation | → | Radioisotope | Decay Products |
|---|---|---|---|---|---|
| $^{63}Cu$ | + | deuteron or neutron | → | $^{64}Cu$ | β particles, γ rays |
| $^{64}Ni$ | + | proton | → | $^{64}Cu$ | β particles, γ rays |
| $^{62}Ni$ | + | neutron | → | $^{63}Ni$ | β particles |
| $^{6}Li$ | + | neutron | → | $^{3}H$ | β particles |
| $^{146}Nd$ | + | neutron | → | $^{147}Pm$ ($^{146}Nd$ is transmuted to $^{147}Nd$, which beta decays to $^{147}Pm$) | β particles, γ rays |
| $^{209}Bi$ | + | neutron | → | $^{210}Po$ ($^{209}Bi$ is transmuted to $^{210}Bi$, which beta decays to $^{210}Po$) | α particles, γ rays |
| $^{31}P$ | + | neutron | → | $^{32}P, ^{33}P$ | β particles |
| $^{45}Sc$ | + | deuteron or neutron | → | $^{46}Sc$ | β particles, γ rays |
| $^{44}Ca$ | + | deuteron or neutron | → | $^{45}Ca$ | β particles, γ rays |
| $^{88}Sr$ | + | deuteron or neutron | → | $^{89}Sr, ^{90}Sr$ | β particles, γ rays |
| $^{89}Y$ | + | deuteron | → | $^{90}Y$ | β particles, γ rays |
| 150Sm | + | deuteron or neutron | → | $^{151}Sm$ | β particles, γ rays |
| $^{203}Tl$ | + | deuteron | → | $^{204}Tl$ | β particles |
| $^{204}Hg$ | + | deuteron | → | $^{204}Tl$ | β particles |
| $^{209}Bi$ | + | deuteron | → | $^{208}Po, ^{210}Po$ | α particles, γ rays |
| $^{209}Bi$ | + | proton | → | $^{208}Po$ | α particles, γ rays |
| $^{148}Sm$ | + | deuteron | → | $^{148}Eu$ | β particles, γ rays, α particles |
| $^{148}Sm$ | + | deuteron | → | $^{148}Gd$ ($^{148}Sm$ is transmuted to $^{148}Eu$, which beta decays to $^{148}Gd$) | α particles |
| $^{110}Pd$ | + | deuteron or proton | → | $^{110}Ag, ^{111}Ag$ | β particles, γ rays |
| $^{109}Ag$ | + | deuteron or neutron | → | $^{110}Ag$ | β particles, γ rays |
| $^{124}Sn$ | + | Deuteron or proton | → | $^{124}Sb, ^{125}Sb$ | β particles, γ rays |
| $^{59}Co$ | + | deuteron or neutron | → | $^{60}Co$ | β particles, γ rays. |

3. The method of claim 2, wherein the transmutable material and the radiation are selected to yield a β-emitting or an α-emitting radioisotope.

4. The method of claim 3, wherein the substrate is a large band gap semiconductor material selected from the group consisting of $TiO_2$, Si, SiC, GaN, GaAs, ZnO, $WO_3$, $SnO_2$, $SrTiO_3$, $Fe_2O_3$, CdS, ZnS, CdSe, GaP, $MoS_2$, ZnS, $ZrO_2$, and $Ce_2O_3$, and combinations thereof.

5. The method of claim 1, wherein:

the conversion device is a direct conversion device that comprises a first electrode, a second electrode, and a rectifying junction-containing component between and in ohmic contact with the first and second electrodes;

at least a portion of the transmutable material that is transmuted to the radioisotope is located in the first electrode, the second electrode, the rectifying junction-containing component, or a combination thereof;

each of the first electrode and the second electrode comprises an ohmic metal or metalloid that is independently selected from the group consisting of Al, Ag, Ti, Ni, Au, Fe, Cr, Pt, Pb, Mo, Cu, and highly doped silicon, alloys thereof, and combinations of the foregoing elements and/or alloys; and the rectifying junction-containing component comprises a semiconductor p-n rectifying junction or a Schottky rectifying junction.

6. The method of claim 5, wherein the rectifying junction-containing component comprises a semiconductor p-n rectifying junction formed by the contact of a p-doped Si layer and n-doped Si layer.

7. The method of claim 5, wherein the direct conversion device comprises a Schottky rectifying junction formed by the contact of a Schottky metal layer in rectifying contact with a Schottky semiconductor, wherein the Schottky semiconductor is either the substrate or a Schottky semiconductor layer, wherein the Schottky metal is selected from the group consisting of Pt, Au, Pd, Fe, Co, Cr, Ni, Ag, Ti, Ru, Cu, Mo, Ir, and Rh, alloys thereof, and combinations of the foregoing metallic elements and/or alloys.

8. The method of claim 1, wherein the unactivated integrated circuit-type battery further comprises shielding, which allows for transmission of the transmuting radiation but reduces or prevents transmission of the decay products of the radioisotope, and wherein the shielding is free or essentially free of a radioisotope and materials capable of transmuting to a radioisotope by the exposure to the radiation.

9. The method of claim 1, wherein the unactivated integrated circuit-type battery comprises a multiplicity of unactivated cells that are essentially identical and activated by the exposure to the radiation, wherein the unactivated integrated circuit-type battery is on the substrate and the multiplicity of unactivated cells are in a stacked arrangement and connected in series, in parallel, or a combination thereof.

10. The method of claim 9, wherein at least portions of a multiplicity of the unactivated integrated circuit-type batteries are exposed to the radiation to transmute at least portions of the transmutable materials associated with each unactivated cell of each unactivated integrated circuit-type battery to the radioisotopes thereby producing each active cell of each active radioisotope battery thereby yielding a multiplicity of active radioisotope batteries that are connected in series, in parallel, or a combination thereof.

11. The method of claim 10, wherein each unactivated battery is in electrical connection with one or more integrated circuits on the substrate and, upon being exposed to the radiation, the electrical energy capable of performing work from the active batteries allows for operation of the one or more integrated circuits, wherein the one or more integrated circuits are shielded from the radiation by layer comprising a transmutable material that absorbs all or substantially all of the radiation, and wherein the exposure of at least a portion of each unactivated battery is accomplished via selective irradiation which limits radiation exposure to selected portion(s) of each unactivated battery, wherein the selective irradiation is accomplished by one or more of the following:

controlling the cross-sectional area of the radiation contacting the unactivated batteries;

controlling the trajectory of the radiation;

controlling the relative positions of the source of the radiation and the selected portion(s) of the unactivated batteries; and placing one or more shadowmasks between the radiation source and the unactivated batteries.

12. An integrated circuit-type active radioisotope battery produced by the method of claim 1.

13. An integrated circuit-type active radioisotope battery produced by the method of claim 2.

14. An integrated circuit-type active radioisotope battery produced by the method of claim 4.

15. An integrated circuit-type active radioisotope battery produced by the method of claim 5.

16. An integrated circuit-type active radioisotope battery produced by the method of claim 7.

17. An integrated circuit-type active radioisotope battery produced by the method of claim 8.

18. An integrated circuit-type active radioisotope battery produced by the method of claim 9.

19. A multiplicity of integrated circuit-type active radioisotope batteries produced by the method of claim 10.

20. A multiplicity of integrated circuit-type active radioisotope batteries produced by the method of claim 11.

* * * * *